United States Patent
Hsu et al.

(10) Patent No.: US 7,057,191 B2
(45) Date of Patent: Jun. 6, 2006

(54) METHOD OF CONTROLLING IMPLANT DOSAGE AND PRESSURE COMPENSATION FACTOR IN-SITU

(75) Inventors: Heng-Kai Hsu, Hsinchu (TW); Yu-Chi Chen, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/966,595

(22) Filed: Oct. 14, 2004

(65) Prior Publication Data

US 2005/0092940 A1    May 5, 2005

(30) Foreign Application Priority Data

Nov. 4, 2003    (TW) .................................. 92130762

(51) Int. Cl.
G21K 5/10    (2006.01)
H01J 37/08    (2006.01)

(52) U.S. Cl. .............................. 250/492.21; 250/492.1; 250/402.1; 250/492.23; 250/492.3

(58) Field of Classification Search ..................... None
See application file for complete search history.

(56) References Cited

U.S. PATENT DOCUMENTS

| | | | | |
|---|---|---|---|---|
| 4,234,797 A | * | 11/1980 | Ryding | 250/492.3 |
| 4,539,217 A | * | 9/1985 | Farley | 427/10 |
| 4,587,433 A | * | 5/1986 | Farley | 250/492.2 |
| 5,760,409 A | * | 6/1998 | Chen et al. | 250/492.21 |
| 5,814,823 A | * | 9/1998 | Benveniste | 250/492.21 |
| 6,297,510 B1 | * | 10/2001 | Farley | 250/492.21 |
| 6,657,209 B1 | * | 12/2003 | Halling | 250/492.21 |
| 2004/0251432 A1 | * | 12/2004 | Sano et al. | 250/492.21 |
| 2005/0092940 A1 | * | 5/2005 | Hsu et al. | 250/492.21 |
| 2005/0181621 A1 | * | 8/2005 | Borland et al. | 438/752 |

FOREIGN PATENT DOCUMENTS

JP    10226880 A    *    1/1998

* cited by examiner

*Primary Examiner*—John R. Lee
*Assistant Examiner*—Bernard E. Souw
(74) *Attorney, Agent, or Firm*—J.C. Patents

(57) ABSTRACT

A method of controlling the implant dosage is provided. First, the residual gases within an ion implant station are analyzed and the partial pressure of each residual gas is measured. Thereafter, the current Im of the ion beam is measured and the real dosage Ir of the ion beam implanted into a wafer is calculated. Since all the residual gases in the ion implant station are considered, the implanting dosage can be accurately controlled.

7 Claims, 2 Drawing Sheets

METHOD OF CONTROLLING IMPLANT DOSAGE AND PRESSURE COMPENSATION FACTOR IN-SITU

CROSS-REFERENCE TO RELATED APPLICATION

This application claims the priority benefit of Taiwan application serial no. 92130762, filed on Nov. 4, 2003.

BACKGROUND OF THE INVENTION

1. Field of the Invention

The present invention relates to a method of controlling the implant dosage and the pressure compensation factor in situ. More particularly, the present invention relates a method of controlling the in-situ pressure compensation factor through a residual gas analyzer (RGA) so that the concentration of ions implanted into a wafer can be accurately controlled.

2. Description of the Related Art

Ion implantation is commonly adopted technique for implanting dopants into a wafer or specified regions of the wafer in the process of fabricating semiconductor devices. With the reduction in the size of semiconductor devices and an increase in the level of integration, the amount of dopants implanted into designated areas of the wafer must be meticulously controlled. One major factor affecting the concentration of dopants inside an implanted wafer is the degree of vacuum within the processing chamber of an ion implant station. In general, the degree of vacuum inside an ion implant station will deteriorate in proportion to the length of application time. The reason is that the absorbability of the cooling pump for withdrawing air from a high vacuum chamber of the ion implant station will deteriorate with long-term operation. Furthermore, residual gases inside the vacuum chamber will reduce the degree of vacuum and some of the residual gases will react with a portion of the ion beam in a charge exchange reaction. Ultimately, the actual charging state of the ion beam may differ from the preset parametric value. In other words, if a portion of the ions is neutralized to atoms as a result of a charge exchange reaction between the residual gases and the ion beam, the current meter inside the ion implant station will not account for the neutralization. Thus, the current value registered by the current meter inside the ion implant station will be lower than the actual ion beam. Conversely, if the charge exchange reaction between the residual gases and the ion beam has the tendency to strip electrons from the ion beam, the current value registered by the current meter inside the ion implant station will be higher than the actual ion beam.

To resolve the aforementioned problem, the concept of a pressure compensation factor has been introduced. Through the presetting of a pressure compensation factor, the inaccuracy of implant dosage due to a deterioration of the degree of vacuum in an ion implant station is compensated. To determine the pressure compensation factors in the conventional technique, a series of ion implants on a wafer coated with a photoresist layer is performed using different pressure compensation factors and then the sheet resistance of the wafer is measured. Therefore, a linear relation between the pressure compensation factor of the photoresist-coated wafer and the sheet resistance is obtained. In addition, a series of ion implants on a blank wafer is performed using different pressure compensation factors and the sheet resistance of the blank wafer is measured. Thus, a linear relation between the pressure compensation factor of the blank wafer and the sheet resistance is obtained. The cross over point between the two aforementioned linear relations is the proposed setting of the pressure compensation factor.

However, the aforementioned method of determining the pressure compensation factor is based on operations in an ion implant station capable of producing a high degree of vacuum and having a high degree of cleanliness. Therefore, the pressure compensation factor obtained from an ion implant station will be highly inaccurate when the degree of vacuum inside the processing chamber drops or there are variations in other factors. As a result, the ion implant dosage cannot be controlled accurately.

SUMMARY OF THE INVENTION

Accordingly, at least one objective of the present invention is to provide a method of controlling the implant dosage effected by an ion implant station so that the accuracy of the implant is increased despite a drop in the degree of vacuum inside the ion implant station.

At least a second objective of the present invention is to provide a method of controlling the pressure compensation factor inside an ion implant station in-situ so that the problem of obtaining an inaccurate pressure compensation factor and providing an inaccurate implant dosage is avoided.

To achieve these and other advantages and in accordance with the purpose of the invention, as embodied and broadly described herein, the invention provides a method of accurately controlling the implant dosage of an ion implant station. First, the residual gases within the ion implant station are analyzed and the partial pressure of each residual gas is measured. If there are three residual gases within the implant station, the partial pressure of the first, second and third residual gas are P1, P2 and P3 respectively. The K value of the first, second and third residual gas are K1, K2 and K3 respectively, wherein K value describes how strongly an ion beam interacts with the residual gas. Thereafter, the current Im of the ion beam is measured and the real dosage Ir of the ion beam implanted into a wafer is calculated using the following equation: $Im = Ir \times e^{-(K1P1+K2P2+K3P3)}$.

In one preferred embodiment, the method of obtaining the K values K1, K2 and K3 includes the following steps. First, an ion beam is produced inside an ion implant station having a high degree of vacuum. Thereafter, a first residual gas is slowly injected into the ion implant station until the pressure of the ion implant station is increased by 2 to 3 orders of magnitude. After that, the pressure (P1') inside the ion implant station is registered and the current (Im') of the ion beam is measured. Furthermore, the current Ir' is set to be the current of the ion beam in the vacuum state. According to the formula: $Im' = Ir' \times e^{-(K1P1')}$, the value of K1 is obtained. By repeating the aforementioned process, the value of K2 and K3 are also obtained.

The present invention also provides a method of controlling the pressure compensation factor in-situ during an ion implant process. The method includes installing a residual gas analyzer inside an ion implant station and using the residual gas analyzer to analyze the type and partial pressure of the residual gases inside the ion implant station. Thereafter, according to the type and pressure of the residual gases inside the ion implant station, the pressure compensation factor of the ion implant station is adjusted in-situ.

In the present invention, the partial pressure of various residual gases inside the ion implant station and the charge exchange reaction between the residual gases and the ion beam are taken into consideration. Therefore, a highly accurate control of the ion implant dosage can be achieved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
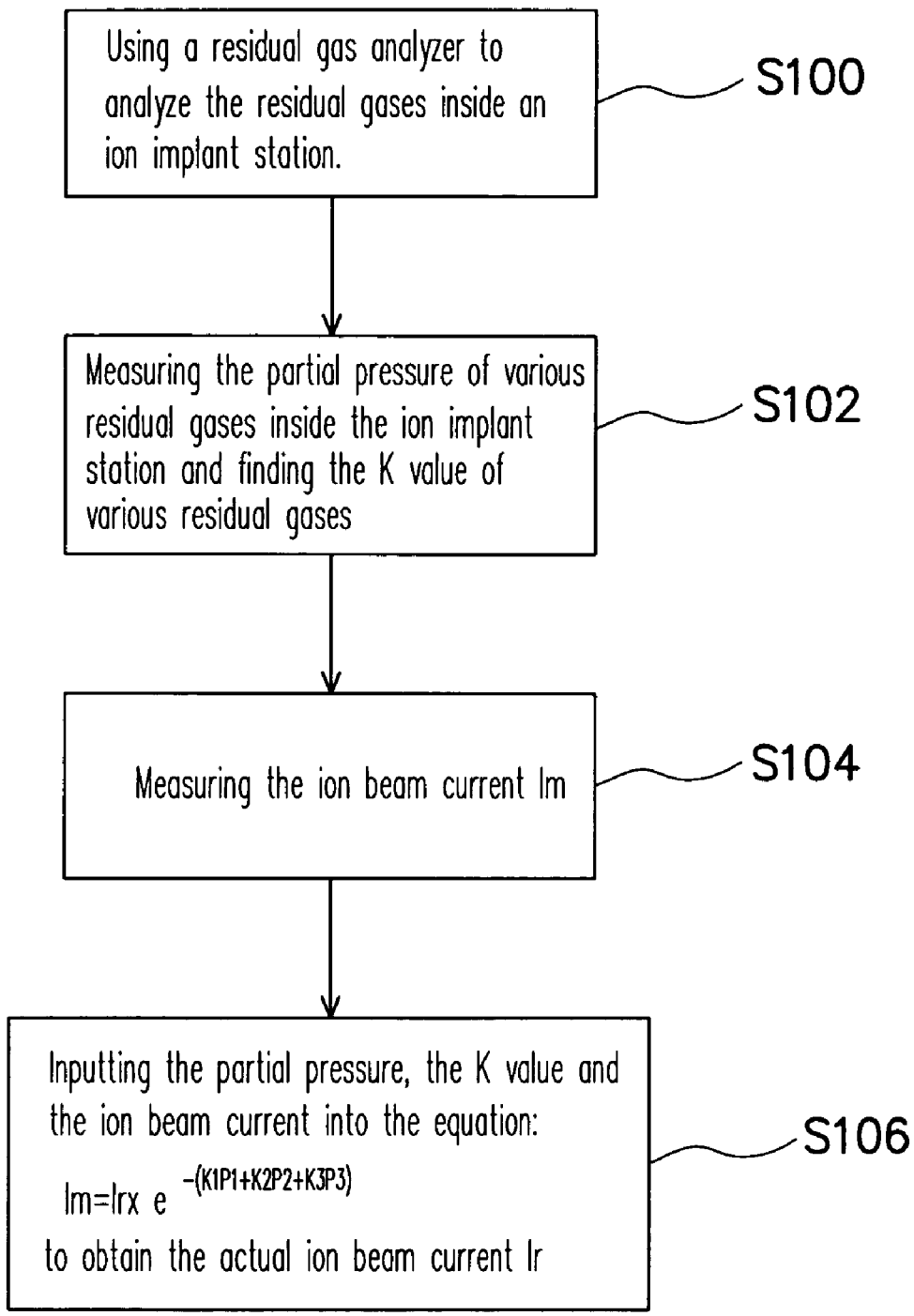
FIG. 1 is a flow chart showing the steps for accurately controlling the ion implant dosage according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps for accurately controlling the ion implant dosage according to one preferred embodiment of the present invention. First, in step S100, the residual gases inside an ion implant station is analyzed using a residual gas analyzer (RGA). Through the analysis, the type of residual gases inside the ion implant station is obtained. In general, the residual gases are related to the gases previously passed into the ion implant station for carrying out an ion implant process including, for example, argon, carbon dioxide, oxygen, nitrogen, water vapor or hydrogen.

In step S102, the partial pressure of various residual gases inside the ion implant station is measured. The method of measuring the partial pressure of the residual gases includes using the aforementioned residual gas analyzer. If the aforementioned step detects three types of residual gases (a first, a second and a third type of residual gas), the partial pressure of the first, second and third type of residual gas are registered as P1, P2 and P3 respectively. According to the type of residual gases in the ion implant station, the K value of the residual gases (K1, K2 and K3 for the first, second and third residual gas) can be found, where the K values describe how strongly an ion beam interacts with the residual gases. Hence, the K value of each residual gas is based on the type of residual gas and its properties. In particular, the value of K has a direct relation with the pressure compensation factor.

In step S104, the current Im of the ion beam is measured. The method of measuring the current Im includes using a current meter, for example, a Faraday cup inside the ion implant station.

In step S106, the partial pressure of various residual gases, the K values and the current Im measured by the Faraday cup are fed to the following mathematical formula:

$$Im = Ir \times e^{-(\sum_{n=1}^{N} KnPn)}$$

to obtain the actual implant current Ir of the ion beam, wherein N is the quantity of the residual gas types.

Figure 2:
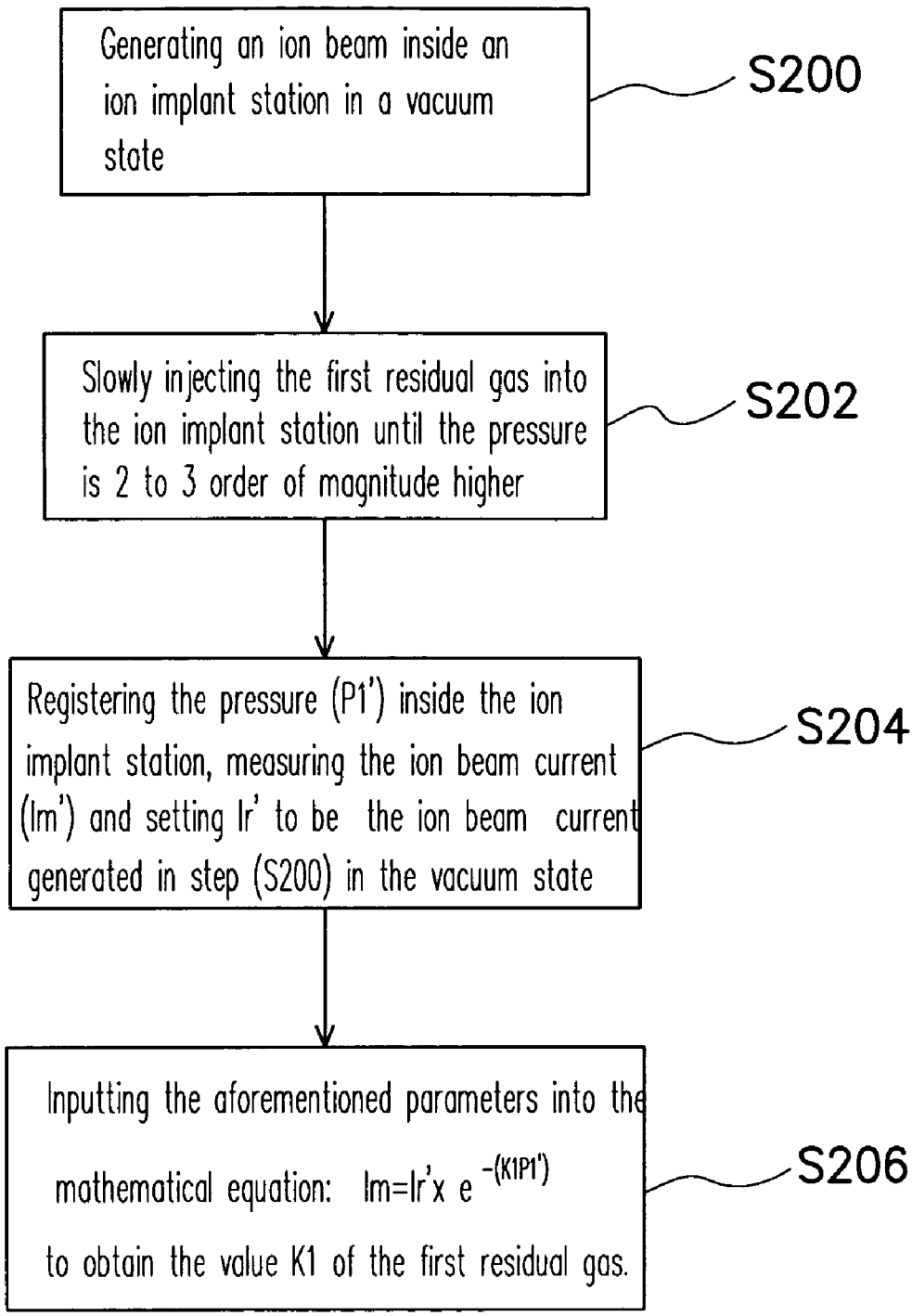
FIG. 2 is a flow chart showing the steps for obtaining the K values of various residual gases according to one preferred embodiment of the present invention.

It should be noted that the method of obtaining the K value of various residual gases, for example, K1 for the first residual gas, K2 for the second residual gas and K3 for the third residual gas is explained in more detail using the flow chart in FIG. 2.

In step S200, an ion beam is produced inside an ion implant station in a high vacuum state. The ion beam is the same type of ion beam for carrying out the designed ion implantation and the degree of vacuum in the aforesaid vacuum state is between 5E-7 to 5E-9 Torr, preferably 5E-8 Torr.

In step S202, a first residual gas is slowly injected into the ion implant station until the pressure inside the ion implant station is increased by 2 to 3 orders of magnitude. The method of slowly injecting the first residual gas into the ion implant station includes adjusting the gas injection rate through a leak valve. The pressure after injecting the first residual gas into the ion implant station is between 5E-4 to 5E-7 Torr, preferably 5E-5 Torr.

In step S204, the pressure (P1') inside the ion implant station is registered and the current (Im') of the ion beam is measured. Furthermore, the current of the ion beam generated under the vacuum state in step S200 is set to Ir'.

In step S206, the aforementioned parameters are inserted into the formula: $Im' = Ir' \times e^{-(K1P1')}$ to obtain the value of the constant K1 of the first residual gas. The method of measuring the current (Im') of the ion beam includes using the current meter, for example, a Faraday cup inside the ion implant station.

The value of the constant K2 of the second residual gas and the value of the constant K3 of the third residual gas are obtained in a similar way. The only difference is that the gas injected in step S202 is changed to the second residual gas and the third residual gas. Since the method of generating the ion beam, the method of registering the partial pressure and the method of measuring the ion beam current are identical, a detailed description of these steps is not repeated here.

The present invention utilizes a residual gas analyzer set up inside an ion implant station to determine the type of residual gases and the partial pressure of each residual gas inside the ion implant station. Thereafter, according to the type of residual gases and their partial pressures, the pressure compensation factor of the ion implant station is adjusted or controlled in-situ. In other words, the state of the residual gases inside the ion implant station at any instance, whether in the middle of an ion implant process or before or after an ion implant process, can be easily determined through the residual gas analyzer. Therefore, the present invention provides a means of analyzing the residual gases inside the ion implant station and updating the vacuum state inside the ion implant station so that the pressure compensation factor can be adjusted at any time.

The method in the present invention takes into consideration the type and partial pressure of all the residual gases inside the ion implant station instead of grouping all the residual gases together as a single homogenous gaseous mixture. That means, the pressure compensation factor or the implant dosage is no longer computed using a single pressure parameter and a single K value. Thus, the present invention is able to control the implant dosage accurately.

For example, a brand new ion implant station can produce the highest degree of vacuum. Hence, the implant dosage in an implant operation can be accurate up to 99%. However, the degree of vacuum produced by the ion implant station may drop in two years time so that the implant dosage is only accurate up to 85%. Yet, using the method of the present invention, a two-year-old ion implant station, the accuracy of the implant dosage can be boosted up to almost the same level as a brand new ion implant station (having 99% accuracy).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of controlling an ion implant dosage, comprising the steps of:
    providing residual gases inside an ion implant station, wherein the residual gases contain N types of gases;
    measuring partial pressures of the residual gases inside the ion implant station, wherein an $n^{th}$ residual gas has a partial pressure $P_n$ and a K value $K_n$, where n is an integer between 1 and N, the K value $K_n$ describes how strongly an ion beam interacts with the $n^{th}$ residual gas;
    measuring the current $I_m$ of the ion beam; and
    determining the actual implant current $I_r$ of the ion beam by the formula:

$$I_m = I_r \cdot \exp-\left(\sum_{n=1}^{N} K_n P_n\right),$$

where N is the quantity of the residual gas types.

2. The method of claim 1, wherein the residual gases inside the ion implant station is analyzed using a residual gas analyzer.

3. The method of claim 2, wherein analyzing the residual gases inside the ion implant station using the residual gas analyzer is carried out in-situ.

4. The method of claim 2, wherein the partial pressure of various residual gases inside the ion implant station are measured using the residual gas analyzer.

5. The method of claim 1, wherein the steps for obtaining the value of K1, K2 and K3 comprise:
    generating an ion beam inside the ion implant station under a vacuum state;
    slowly injecting the first residual gas into the ion implant station until the pressure inside the ion implant station is increased by 2 to 3 orders of magnitude;
    registering the pressure (P1') inside the ion implant station, measuring the ion beam current (Im'), setting the value of Ir' of the ion beam under the vacuum state and finding the value of K1 using the formula: Im'=Ir'×e$^{-(K1P1')}$; and
    repeating the aforementioned steps by injecting the second residual gas and the third residual gas in turn to obtain their partial pressure and ion beam current necessary for computing the value of K2 and K3.

6. The method of claim 5, wherein the vacuum state is between 5E-7 Torr to 5E-9 Torr.

7. A method of controlling a pressure compensation factor in situ during an ion implant process, comprising the steps of:
    installing a residual gas analyzer inside an ion implant station;
    finding the types of residual gases and their partial pressure inside the ion implant station using the residual gas analyzer; and
    controlling the pressure compensation factor of the ion implant station in-situ according to the types of residual gases and partial pressures of the residual gases from an analysis.

* * * * *